United States Patent
Claussen et al.

(10) Patent No.: US 11,883,947 B2
(45) Date of Patent: Jan. 30, 2024

(54) MACHINE LEARNING ENABLED VISUAL SERVOING WITH DEDICATED HARDWARE ACCELERATION

(71) Applicant: Siemens Aktiengesellschaft, Munich (DE)

(72) Inventors: Heiko Claussen, Wayland, MA (US); Martin Sehr, Kensington, CA (US); Eugen Solowjow, Berkeley, CA (US); Chengtao Wen, Redwood City, CA (US); Juan L. Aparicio Ojea, Moraga, CA (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/761,613

(22) PCT Filed: Sep. 30, 2019

(86) PCT No.: PCT/US2019/053777
§ 371 (c)(1),
(2) Date: Mar. 18, 2022

(87) PCT Pub. No.: WO2021/066794
PCT Pub. Date: Apr. 8, 2021

(65) Prior Publication Data
US 2022/0347853 A1      Nov. 3, 2022

(51) Int. Cl.
*B25J 9/16*     (2006.01)
*B25J 13/08*    (2006.01)
*G06F 30/10*    (2020.01)

(52) U.S. Cl.
CPC ............. *B25J 9/1697* (2013.01); *B25J 13/08* (2013.01); *G06F 30/10* (2020.01)

(58) Field of Classification Search
CPC . B25J 9/1697; B25J 13/08; B25J 9/163; B25J 9/1664; B25J 9/1687; G06F 30/10; G05B 2219/40032
(Continued)

(56) References Cited

U.S. PATENT DOCUMENTS 4,305,130 A * 12/1981 Kelley .................. G06T 1/0014
                                                   901/17
4,833,383 A *  5/1989 Skarr ..................... B25J 9/1697
                                                   901/47
(Continued)

FOREIGN PATENT DOCUMENTS

CN      103400392 A     11/2013
CN      108068107 A      5/2018
(Continued)

OTHER PUBLICATIONS

International Search Report corresponding to application No. PCT/US2019/053777; 5 pages.

*Primary Examiner* — Jaime Figueroa

(57) ABSTRACT

A system controller for visual servoing includes a technology module with dedicated hardware acceleration for deep neural network that retrieves a desired configuration of a workpiece object being manipulated by a robotic device and receives visual feedback information from one or more sensors on or near the robotic device that includes a current configuration of the workpiece object. The hardware accelerator executes a machine learning model trained to process the visual feedback information and determine a configuration error based on a difference between the current configuration of the workpiece object and the desired configuration of the workpiece object. A servo control module adapts a servo control signal to the robotic device for manipulation of the workpiece object in response to the configuration error.

14 Claims, 3 Drawing Sheets

(58) Field of Classification Search
USPC .............. 700/245–264; 318/568.11–568.25
See application file for complete search history.

(56) References Cited

U.S. PATENT DOCUMENTS

| | | | |
|---|---|---|---|
| 6,278,906 B1* | 8/2001 | Piepmeier | B25J 9/1607 |
| | | | 700/59 |
| 10,059,001 B2 | 8/2018 | Miyazawa et al. | |
| 10,383,694 B1 | 8/2019 | Venkataraman et al. | |
| 2006/0155398 A1* | 7/2006 | Hoffberg | G06V 40/103 |
| | | | 700/86 |
| 2015/0258683 A1 | 9/2015 | Izhikevich et al. | |
| 2018/0222057 A1* | 8/2018 | Mizobe | B25J 9/161 |
| 2018/0222058 A1* | 8/2018 | Mizobe | B25J 9/163 |
| 2019/0243371 A1* | 8/2019 | Nister | G05D 1/0231 |
| 2020/0061811 A1* | 2/2020 | Iqbal | G06N 3/08 |
| 2020/0353620 A1* | 11/2020 | Hasunuma | B25J 19/023 |
| 2020/0361083 A1* | 11/2020 | Mousavian | B25J 9/1612 |
| 2021/0086364 A1* | 3/2021 | Handa | G06T 1/0014 |

FOREIGN PATENT DOCUMENTS

| | | |
|---|---|---|
| CN | 110000795 A | 7/2019 |
| CN | 110039542 A | 7/2019 |
| CN | 110135443 A | 8/2019 |
| EP | 2868441 A1 | 5/2015 |
| WO | 20150058297 A1 | 4/2015 |
| WO | 2019116891 A1 | 6/2019 |
| WO | 20190116891 A1 | 6/2019 |
| WO | 2019146007 A1 | 8/2019 |

* cited by examiner

MACHINE LEARNING ENABLED VISUAL SERVOING WITH DEDICATED HARDWARE ACCELERATION

TECHNICAL FIELD

This application relates to control of dynamical systems. More particularly, this application relates to applying machine learning to position error estimation and dedicated hardware acceleration to image processing for visual servos.

BACKGROUND

Visual Servoing (VS) is a class of techniques to control dynamical systems, such as robot control systems, by using feedback data provided by one or multiple visual sensors or cameras. Visual servoing is considered a classical problem in robotics, which has not been satisfactorily solved so far. In order to achieve the VS objective, the object of interest needs to be moved by the machine to match a target configuration of visual features or image intensities that include the object. Many control tasks that combine perception and action can be posed as VS problems. For example, the placement of a work piece into a fixture by a robot can be solved with VS. In comparison to control methods that do not include vision information, VS offers several distinct advantages. Due to the visual feedback, the hardware (e.g., position sensors or the rigidity of structural components) can be less precise, which results in lower cost. VS allows for greater generalization and reduced engineering effort. Instead of specifying the desired paths and trajectories, VS enables the robotic control objective to be defined by desired visual states of the object of interest.

While VS seems to be a very appealing control approach, practical implementations are rare. VS requires solving two technical problems. The first problem is the computation of a configuration error from visual information. For example, if an object needs to be placed into an aperture or slot, then a VS algorithm needs to extract visual features such as edges and corners from the incoming image stream in order to compute the error in distance and orientation of the object and its target location. This is a difficult task due to noise and disturbances such as varying ambient light conditions, occlusions and others. Current solutions include using color coded objects to distinguish the object from the environment, and relying on a filter to derive the distinction. For complex environments, feature extractors require manual engineering based on a particular frame or the object. The second technical problem of VS originates from the implementation itself. Continuous control of a dynamical system, such as a robot, requires control loops with low latencies and high sampling rates. VS includes online image processing steps within the control loop, which is a computationally expensive operation.

VS is currently approached in a similar way as image classification in the pre-Deep Learning era. Visual feature detectors are hand designed and rigorously fine-tuned for the problem at hand. These features can include points, lines, or shapes. At runtime, the detector identifies the features in the visual observation and computes the configuration error to a desired feature state. This error is used as an input to a feedback control law that allows changing the configuration space through an actively actuated apparatus such as a robot. Similar to hand-engineered classification algorithms in computer vision, this "conventional" approach to VS lacks robustness and requires a large amount of engineering effort. The open-source library ViSP from INRIA is considered state-of-the-art for VS with manually specified visual features.

One reason why deep learning has rendered manually engineered feature detectors obsolete in classification tasks, but not in VS so far, is the type of required output. In classification problems, deep neural networks output a discrete class. However, VS requires a relative configuration, which consists of continuous positions and orientations, having greater complexity than a classification solver can provide.

SUMMARY

Aspects according to embodiments of the present disclosure include an approach for overcoming the aforementioned technical problems of VS by introducing machine learning-based configuration error estimation to VS and by exploiting functionality of accelerator processors configured for machine learning inference to achieve low latencies for image processing.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Methods and systems are disclosed for a system controller which utilizes a machine learning model (e.g., a deep neural network (DNN)) driven by a hardware accelerator for visual servoing (VS) of a robotic device. Using two input images, one image being a representation of the desired (reference) configuration of a workpiece object and the other image being a vision capture of the current configuration of the object, a trained machine learning base model determines a configuration error as a low-dimensional quantity. A dynamic controller uses the configuration error to compute control actions that reduce the configuration error by moving the object of interest closer to the desired configuration. As a hybrid hardware framework, the machine learning based model operation is enhanced by a dedicated hardware accelerator configured for deep learning inferences and is integrated with a conventional dynamic controller (e.g., such as a servo controller), where the machine learning model processes the visual content more effectively so that the dynamic controller only has to consider a low-dimensional configuration error. In contrast with conventional VS systems, the enhanced visual processing is adaptable to real-time changes in the environment (e.g., movement of workpiece, work process, or both, with respect to the robotic device. The dedicated hardware accelerator provides fast inference results (e.g., ~10 ms from captured image to result) allowing model training refinement in real time. Such rapid results also allow for improved reaction capability, even for control of lower quality robotic devices with poor precision of motion control. The closed loop control performance provided by the machine learning enhancement is more robust than current approaches, being less influenced by camera miscalibrations, occlusions, and suboptimal ambient lighting. In contrast with conventional closed loop control VS programs that contain loops and conditionals with unpredictable computational times, the enhanced VS control loop of this disclosure has a constant computation runtime that executes the same amount of mathematical operations at every forward pass, providing low latency at a high sampling rate despite image processing in the loop.

Figure 1:
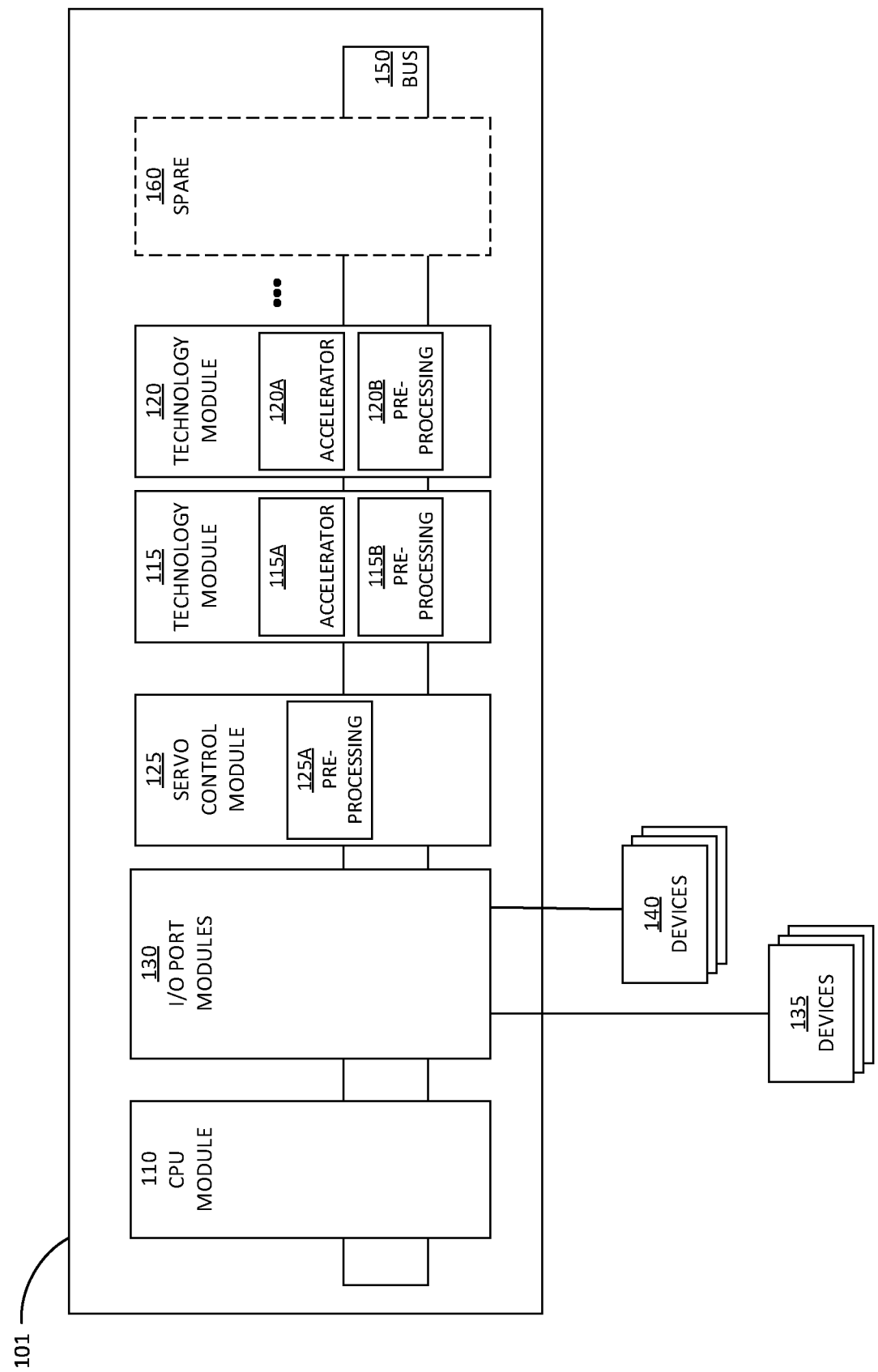
FIG. 1 is a block diagram of an example for a visual servoing system controller in accordance with one or more embodiments of the disclosure.

FIG. 1 illustrates an example of a system controller 101, according to embodiments of the disclosure. The term "system controller" is intended to encompass digital control computers that have functionality for visual servoing of robotic components. Briefly, the system controller 101 includes a CPU module 110, technology modules 115, 120, and a servo control module 125. Each of the modules 110, 115, 120, 125 is connected via a backplane bus 150. The entire system controller 101 may be housed within a common chassis.

As is generally understood in the art, the backplane bus 150 is an internal data bus for transferring data between the modules 110, 115, 120, 125. Various techniques may be used for creating the backplane bus 150. For example, in one embodiment, the backplane bus 150 is part of the chassis and the chassis comprises a plurality of termination inlets (not shown in FIG. 1) that allow the modules 110, 115, 120 to connect to the backplane bus 150. In other embodiments, the modules 110, 115, 120 each include interconnecting plugs (not shown in FIG. 1) that form the backplane bus 150.

The CPU module 110 comprises a processor that performs a series of operations including reading inputs from, for example, the backplane bus 150 or an area of memory within the CPU module 110. The CPU module 110 executes instructions for controlling the data flow between the modules of system controller 101.

Each technology module 115, 120 provides dedicated hardware acceleration by an accelerator processor 115A, 120A configured for fast machine learning inferences, and a pre-processing unit 115B, 120B that executes visual pre-processing algorithms, including but not limited to proportional adjustment of input images and 3D modeling of input images. In an embodiment, pre-processing unit 115B, 120B may evaluate a received image for the current configuration of an object, and on a condition that the object is unknown to the system controller 101 (e.g., not previously observed by a visual sensor 135), then a 3D model can be generated by scanning the object using the visual sensor to create a database of desired configurations. In an aspect, the machine learning model can be previously trained with known objects (e.g., as a classification task), such that unknown objects can be handled based on learning from known objects.

Input/output port modules 130 provide direct connection of devices 135, 140 to backplane bus 150. The devices 135 can include sensors that provide high-speed inputs to the technology modules 115, 120 such as, for example, images, videos, audio signals, vibration sensor values, etc. It should be noted that the inputs may not always be high speed. For example, video has only few frames per second but the data rate is still very high. This is just one example for a measurement that comprise many relatively slowly (e.g., 30 Hz) changing sensor signals (e.g., each pixel). Also, in some instances, the technology module(s) may combine high throughput information with slow data, such as a video stream with the status of the machine. The status of the machine (e.g., an RPM value of a servo motor) can be read through the backplane bus 150 from the CPU module 110 or another input module. The devices 140 may include one or more servo motors of a robotic gripper device, and/or other devices that work in tandem with a robotic device, such as a milling machine or a conveyor, which receive output signals from backplane bus used for control operations of the devices 140 generated by servo control module 125.

Each accelerator processor 115A, 120A is configured to receive input data values related to one or more devices 135 (e.g., via the backplane bus 150). Once these input data values are received, each accelerator processor 115A, 120A executes a machine learning model. The machine learning model may be uploaded onto the technology modules 115, 120 using the input/output port modules 130, the backplane bus 150, or other techniques known in the art (e.g., an SD card).

In some embodiments, each technology module further includes a pre-processing component 115B, 120B configured to generate the input data values for the machine learning models based on data received from the devices 135. For example, images based on visual data inputs from devices 135 may be cropped, widened, zoomed, or a combination thereof, for the purpose of correlating the current configuration to the desired configuration when determining the configuration error. In some instances, the raw input from the device 135 may be directly used as the input data values for the machine learning models. However, in other instances, each pre-processing component 115B, 120B may use a set of rules or functions for transforming the data. For example, a raw analog signal can be sampled to provide time series data that can be used as input. A raw analog time series signal can be transformed into a spectrogram from a defined time period. The spectrogram representation can be generated for every 0.5 seconds with half overlapping windows from raw signals of length 1 second. These spectrograms can be the input for a machine learning model.

The rules or functions for transforming data from a particular device 135 may be pre-loaded on each device prior to installation. Alternatively, the rules or functions may be dynamically loaded as needed. For example, in one embodiment, in response to connecting a particular device 135 via the ports 130, the technology module 115, 120 may retrieve the rules or function for transforming data from that particular device 135 from data source local or external from the controller system 100.

Each accelerator processor 115A, 120A executes one or more machine learning models using the input data values to generate a configuration error. In an embodiment, the configuration error may be converted to an optical flow format. Once generated, the technology modules 115, 120 transfer the configuration error values to the servo control module 125 over the backplane bus 150, and in response, the servo control module 125 generates output data values for controlling devices 140.

In general, any accelerator processor known in the art, also known as an artificial intelligence (AI) accelerator, neural accelerator, or neural processing unit (NPU), may be used in the controller system. For example, in one embodiment, each accelerator processor 115A, 120A deploys an Intel Myriad X processor. The accelerator processor 115A, 120A uses an architecture that is optimized for high bandwidth but low power operation. For example, in some embodiments, an architecture is employed that accelerates by minimizing data transfer within the chip memory (built-in memory) or by accelerating matrix multiplication which is heavily used in neural network computations. In other embodiments, neural network primitives and common data preprocessing functions are implemented in hardware. This allows high performance of operations at a lower power profile in comparison to common alternative implementation such as GPU-based acceleration. For example, a GPU implementation may perform at about 1 TOPS, but uses up to 15W which is not practical in a passively cooled system controller 101. In some embodiments, each accelerator processor 115A, 120A contains one or more CPUs and multiple vector processors for added application flexibility. That is, each accelerator processor 115A, 120A has everything needed to flexibly implement a processing pipeline from the data acquisition (e.g., from USB or Ethernet), preprocessing, machine learning and output to the backplane bus 150 of the controller system. It should be noted that the techniques described herein are not limited to any particular type of accelerator. This flexibility also enables the deployment of machine learning models other than deep neural networks, such as support vector machines, random forest, hidden Markov models, principal component analysis, and others generally known in the art.

With each accelerator processor 115A, 120A directly connected through the backplane bus 150 comes an advantage that the output of the machine learning models is synchronously usable in the system controller 101. That is, at every cycle of the backplane bus 150, the current output values of the technology module 115, 120 can be shared and used for process control by servo control module 125. Also, given this format, the technology module 115, 120 can be attached to most, if not all, other control systems by the use of an interface module that translates the backplane information to another interface such as Process Field Net (PROFINET). That is, any controller that can communicate through this interface and has the interface description to communicate with the technology module can utilize the module. Resource requirements, such as memory, are limited to the shared memory of the backplane bus 150, and the technology modules 115, 120 may be readily incorporated into existing controller systems, thus allowing easy retrofit. As an alternative to the backplane bus 150, the technology modules 115, 120 can be connected to any other type of controller system through a standard interface module that allows the exchange of data via PROFINET (e.g., PROFINET interface modules or PROFIBUS interface modules). In another embodiment, the technology modules are directly connected with PROFINET without requiring an interface module.

Although the example of FIG. 1 shows two technology modules 115, 120 being deployed in system controller 101, the number of technology modules can be increased or decreased as required based on, for example, the number of high speed inputs or processing power required for an application. Additional technology modules may be deployed in one or more spare module slots 150, as needed. Additionally, where multiple technology modules are employed, each technology module maybe dedicated to a different task. For example, a first device 135 implementation may provide Light Detection and Ranging (LIDAR) input to technology module 115, and a second device 135 may be implemented as a 3D point cloud camera to provide point cloud input data to technology module 125 via backplane bus 150. Thus, it is possible to create complex and demanding applications without the performance limits of the hosting controller system. It is even possible to add such modules to a controller system that is already controlling a process with, for example, 30 input/output port modules. Therefore, users can use available installations for additional applications using machine learning analytics of high performance inputs. This limits deployment risks, additional cabling, installation costs, etc. In an aspect, different combinations of input devices 135 and output devices 140 may be connected to technology modules 115, 120. For example, each of two different input devices 135 may be connected to technology module 115 and 120 respectively, for control of a single robotic device 140, with weighted configuration error signals from each machine learning model being evaluated by the servo control module 125 to generate a control signal to the device 140. As another example, a single robotic device 140 an be controlled based on input from two or more camera devices 135 of the same technology type, all connected to a single technology module 115, where the two or more inputs combined provide additional perspective (e.g., triangulation of two or more 2D visual data streams to provide depth perception) for the machine learning model analysis. In an aspect, if size of the object is known, depth can be inferred by size of object in the observed field of view by a visual sensor device 135.

In an aspect, servo control module 125 may include a pre-processing module 125A that may reconfigure a configuration error mapping received from a technology module 115, 120 to account for discovered obstacles near the object to be manipulated by a robotic device 140. For example, one or more exclusion zones for the object may mapped to the obstacles and programmed into the control logic of pre-processing module 125A to ensure that control value outputs from servo controller 125 to a gripper device 140 will control a trajectory path for a grasped object that prevents collision with the obstacle by avoiding the exclusion zones. In an aspect, servo control module 125 may be directly programmed to set limits of servo control values that may reduce compensation for configuration error (i.e., prolong time to objective convergence), yet avoid a discovered obstacle condition.

Continuing with reference to FIG. 1, in some embodiments, the control values may be transferred to the devices 140 via the input/output port modules 130. For example, the accelerator processor 115A, 120A may be used to derive configuration error values which are used by servo control module 125 to generate one or more control values that are then transferred to the devices 140 via the port modules 130. Each of the input/output port modules 130 comprise an input port for transferring the input data values to the respective technology module and an output port for transferring derived control values to one of the devices 140. The input/output port modules 130 can use the same networking protocol or different protocols. For example, in one embodiment, the input port corresponds to a USB connection between the device and the technology module, while the output port corresponds to an Ethernet connection between the device and the technology module.

An advantage of the design shown in FIG. 1 is that devices 135 may include different types of sensors that can be connected and processed. That is, for current systems in the market (e.g., smart cameras, drones, digital companions, etc.), only a single modality or application is solved, while for the design of this disclosure, any data producing system with USB, Ethernet or back plane connectivity can be used as inputs and applications can be customized. If a different modality (e.g., thermal vision) is preferable or a different camera vendor sells a camera that fulfills additional requirements such as the use in an explosion proof environment, it is generally not possible to use the limited offering of machine learning-enabled devices. By enabling plug and play connectivity through standard industrial interfaces, such as USB Vision and Ethernet Vision, the design shown in FIG. 1 is flexible and future proof for a customer. That is, if the original camera is no longer available or a better or cheaper model comes on the market, the user can just plug this in without necessarily requiring reprogramming of the system (the algorithms can be setup to automatically resize the input to the expected input format of the machine learning model). Also, the approach allows the synchronous processing of mixed data (e.g., a camera input through USB), control parameter through the back plane and shared plant variables through Ethernet.

Figure 2:
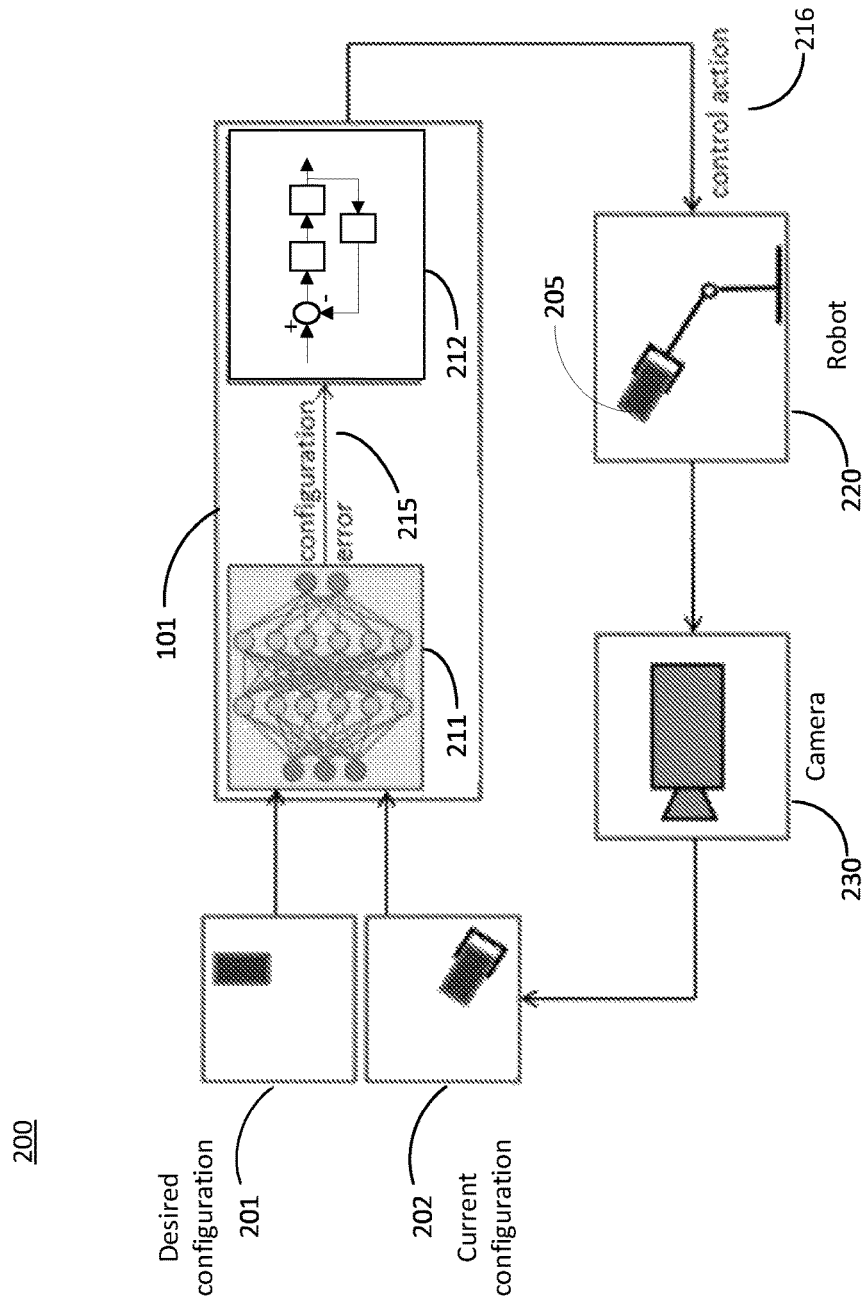
FIG. 2 is a flow diagram of an example for a visual servoing control loop in accordance with one or more embodiments of the disclosure.

FIG. 2 is a flow diagram of an example for a visual servoing process in accordance with one or more embodiments of the disclosure. In this example, system controller 101 as shown and described with respect to FIG. 1 performs a visual servoing task relates to controlling a robotic device 220 with a gripper that grasps, manipulates and places a workpiece 205 to match a desired configuration 201. System controller 101 is shown for controlling behavior of robotic device 220 based on visual feedback information from a camera device 230 arranged on or near robotic device 220. In some embodiments, robotic device 220 may be deployed to coordinate with other devices, such as a drill, miller, conveyer, or other device that may perform a work task on the workpiece 205, where controller 101 controls movement of robotic device 220 for proper placement of workpiece 205 as required by the other device (i.e., defined by an image representing desired configuration 201). The controller 101 uses a machine learning-based inference unit 211, such as a DNN model, with a dedicated hardware accelerator to process two image inputs 201, 202 to determine a configuration error 215. The configuration error 215 is the difference between a desired configuration image 201 and the current configuration 202 image for workpiece 205, which may be computed by vector analysis for example. In an embodiment, rather than a binary error value, the error 215 may be represented by a displacement vector with a magnitude component so that iterative correction by control action signal 216 from dynamic controller 212 can be accelerated. The current configuration image 202 is captured by camera 230 to provide real-time visual feedback as workpiece 205 is presently manipulated by the robotic device 220. Dynamic controller 212 operates by receiving a low-dimensional quantity of configuration error 215 (e.g., a relative pose) and in response, generates a control action signal 216 for positional adjustment of the robotic device 220 in 3D space which reduces the error by moving workpiece 205 nearer to the desired configuration 201. In an embodiment, each control action signal 216 may act on a pulse width modulation of power to a servo motor within robot 220 for fine resolution of motion control of a gripper that has grasped the workpiece 205 and is tasked with placement of the workpiece 205 to a target position represented by the image of desired configuration 201. As a closed control loop, system controller 101 iteratively repeats the above process until the placement of workpiece 205 substantially matches the desired configuration 201 (i.e., the configuration error 215 is reduced to a value at or near zero within a predefined tolerance).

Figure 3:
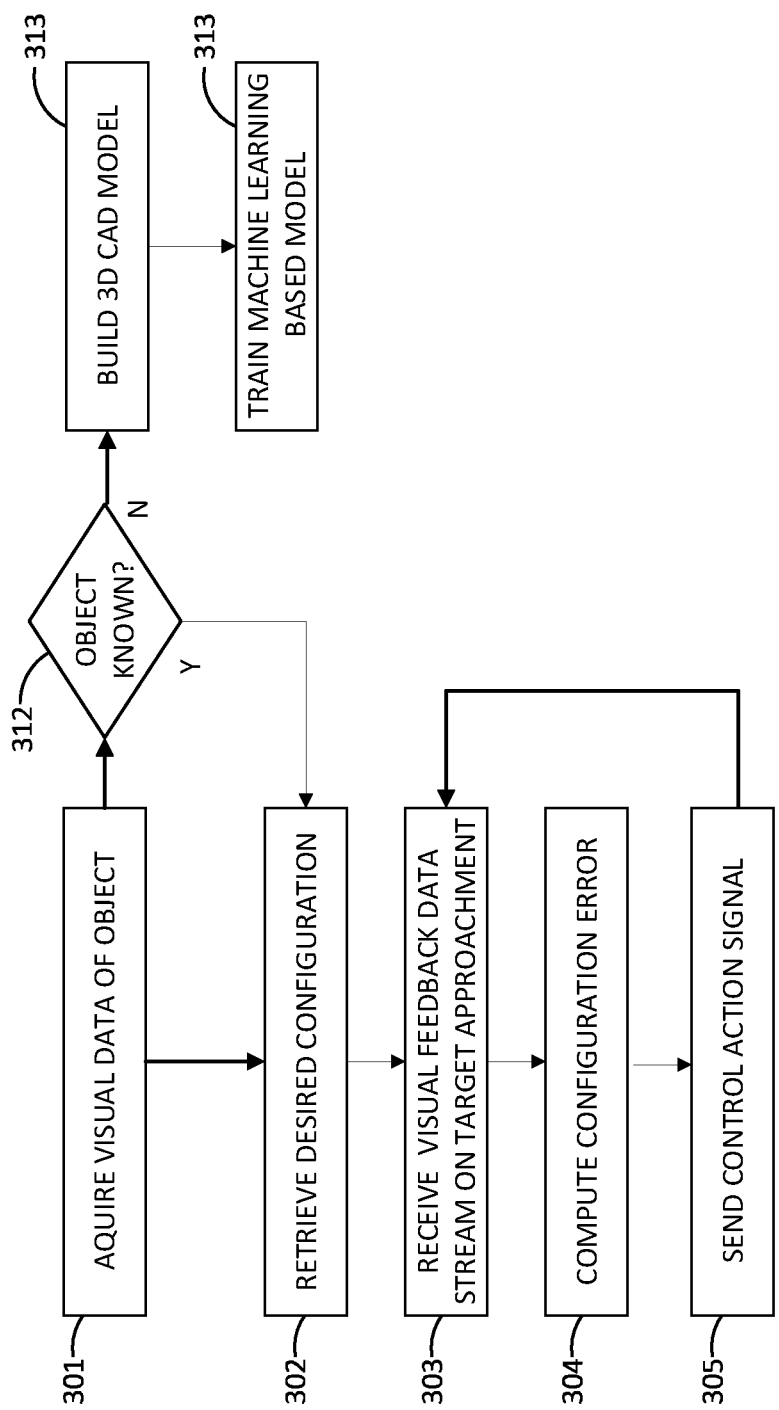
FIG. 3 is a flow diagram of an example for a visual servoing method in accordance with one or more embodiments of the disclosure.

FIG. 3 is a flow diagram of an example for a method of performing an object insertion task by a visual servo controller in accordance with one or more embodiments of the disclosure. In an embodiment, a robotic gripping device is tasked with transporting a grasped unknown object as a workpiece at an approximate location and unknown pose and inserting the object into an aperture of a receiving device (e.g., into a milling machine) or other aperture at a workstation. The robot acquires 301 visual data of the object using, for example, one or more cameras (e.g., 3D cloud point cameras) arranged on or near the robot. As an optional sequence of steps 312-314, the visual representation of the object may be used to classify 312 if the captured visual data indicates a known or unknown object. If the object is unknown, the cameras visually inspect the object to capture visual data and the pre-processing module builds a 3D CAD model 313 of the object based on the visual data. For example, if the cameras are mounted on the robot, the robot may be controlled to circle about the object while aiming the cameras toward the object to capture visual data from all sides of the object. This model is then used to train a machine learning based model 314 for optimized grasping. For example, configuration of known objects may be used to train the machine learning based model, and the 3D model of the unknown object can be used for refinement of the machine learning based model. The robotic device may obtain desired configuration information 302 (e.g., desired workpiece location and pose on or within the receiving device) from a receiving device (e.g., a milling machine or other workstation device) via a wired or wireless communication, or a database (e.g., a manufacturing control system database, a work policy database, or the like). In an aspect, the desired configuration may be an image captured by a camera on the robot upon successfully inserting the workpiece object into the receiving station on a previous occasion. As the robotic gripping device operates to manipulate the object along an initial path trajectory approach to the target destination, one or more local cameras stream visual feedback data 303 (either RGB images or 3D point clouds) as current configuration input to the machine learning model enhanced by the dedicated hardware accelerator configured for neural network inference to compute the configuration error 304 (or relative pose) between current and desired configurations. The dynamic controller generates a control action signal based on the configuration error and sends the control action signal 305 to one or more servo motors of the robot, thus moving the object closer to the desired configuration. With repeated iterations of steps 303-305, the path of the object via robotic control is adjusted and continuously adapted in real time based on the mismatch of the current location and pose against desired location and pose.

In some embodiments, as a variation to the example shown in FIG. 3, the visual feedback data stream may be images of the target aperture, and the configuration error may be computed by the machine learning model trained to determine the difference between the desired configuration of the workpiece object (e.g., pose and location) and the extracted features of the aperture (e.g., the computed relative distance and orientation) as the workpiece object approaches the target.

In an embodiment, the desired configuration may change due to workstation and/or receiving device motion concurrent with the object motion. In contrast to just relying on the robot sensors, this approach can adapt to real-time changes in the environment (e.g., if the workpiece or receiving device are moving relatively to the robot) and can recover from misalignments. Also, using the enhanced VS of this disclosure, the robot can handle unknown objects, and place them by a defined policy at the receiving device and communicate with the receiving device about the final placement and pose for its operation. Given the fast inference result (e.g., 20 ms from image to result) of hardware neural network accelerators in the system controller 101 arranged at the edge, the machine learning model training can be refined in real time at the edge by comparing the effect of a handling step in the real world with the simulated result, thus bringing both real world and simulation more and more in sync.

Various other control tasks can be programmed into the system controller 101, in addition to the aforementioned tasks. For example, a servo motor controlling movement of the work surface below the workpiece object may be controlled in a similar manner. In an aspect, in response to discovery of a work environment that has become more complicated (e.g., new obstructions to the workpiece), constraints may be added to the servo controller 125 logic or to cost function computation encoded in the machine learning model.

In addition to aforementioned advantages, the disclosed embodiments provide technical advantages including real-world feedback as a workpiece object may be in motion, such that each iteration of closed loop control generates a displacement error, while approaching the objective with each step. In contrast, conventional visual recognition systems apply a neural network operation with an objective of identifying a 3D or 6D pose estimation of a stationary object, relying on a simulated model of the object rather than real-time visual feedback. Another advantage of the disclosed system controller is that reliance on specific control parameters of the system is not required as the feedback control operates iteratively by altering a parameter and observing if the error is decreasing or increasing, which provides an abstracted control. Hence, the close loop control is optimized to the goal of matching a desired configuration, without knowledge about what parameters need to be changed. Rather, the control system simply reacts to any changed parameter, and determines whether the motion control signal moves the object closer or further from goal. As a result, very complex systems, even for manipulating unknown objects, can be controlled with rapid convergence to the objective.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof.

What is claimed is:

1. A system controller for visual servoing, comprising:
a technology module comprising an accelerator processor for machine learning configured to:
retrieve a desired pose configuration of a workpiece object being manipulated in its pose by a robotic device;
iteratively receive from one or more sensors on or near the robotic device visual feedback information that includes a current pose configuration of the workpiece object; and
iteratively execute a machine learning model trained to process the visual feedback information and determine a low dimensional pose configuration error based on a difference between the current pose configuration of the workpiece object and the desired pose configuration of the workpiece object;
a pre-processing module configured to build a 3D CAD model of the workpiece object based on the visual feedback information on a condition that visual feedback information indicates that the object is unknown to the system controller, wherein the machine learning model is configured to use the 3D CAD model as training input to refine the machine learning model; and
a servo control module configured to iteratively adapt a servo control signal to the robotic device for manipulation of the workpiece object in response to the pose configuration error.

2. The system of claim 1, wherein a target destination for the workpiece object is a receiving device comprising an aperture into which the workpiece object is to be inserted, wherein the desired pose configuration is retrieved from the receiving device.

3. The system of claim 2, wherein the machine learning model is configured to extract features of the aperture from the visual feedback information.

4. The system of claim 1, wherein the technology module further comprises:
a pre-processing module configured to generate input data values for the machine learning model by cropping, widening, or zooming of images received in the visual feedback information.

5. The system of claim 1, wherein the workpiece object is unknown to the system controller and the machine learning model determines pose configuration error based on training of known objects.

6. The system of claim 1, wherein the hardware accelerator is configured with an architecture optimized for high bandwidth but low power operation.

7. The system of claim 1, wherein the hardware accelerator is configured with an architecture that accelerates by minimizing data transfer within built-in memory or by accelerating matrix multiplication.

8. The system of claim 1, wherein the machine learning model is configured as a deep neural network, a support vector machine, a random forest, or a hidden Markov model.

9. The system of claim 1, wherein the system controller comprises a plurality of technology modules, with each technology module dedicated to a different task for the controlling the robotic device.

10. The system of claim 1, wherein visual sensor inputs to each technology module are of a different type or modality of high speed inputs.

11. The system of claim 1, wherein the technology module receives visual feedback information from a plurality of visual sensors to provide depth perception.

12. The system of claim 1, wherein the one or more sensors include at least one 3D point cloud camera.

13. The system of claim 1, wherein the servo control module comprises:
a pre-processing module configured to reconfigure the pose configuration error to account for discovered obstacles near the workpiece object by mapping one or more exclusion zones to the obstacles in control logic of the pre-processing module, wherein the servo control signal is adapted to control a trajectory path for the workpiece object the avoids the exclusion zones.

14. The system of claim 1, wherein the servo control module is programmed to set limits to values of the servo control signal to avoid a discovered obstacle condition.

* * * * *